(12) United States Patent
Mejia

(10) Patent No.: US 6,172,900 B1
(45) Date of Patent: Jan. 9, 2001

(54) COMPACT, LOW VOLTAGE, NOISE-IMMUNE RAM CELL

(75) Inventor: Manuel Mejia, San Jose, CA (US)

(73) Assignee: Altera Corporation, San Jose, CA (US)

(*) Notice: Under 35 U.S.C. 154(b), the term of this patent shall be extended for 0 days.

(21) Appl. No.: 09/106,796

(22) Filed: Jun. 29, 1998

Related U.S. Application Data

(60) Provisional application No. 60/071,629, filed on Jan. 16, 1998.

(51) Int. Cl.[7] .................................................. G11C 11/40
(52) U.S. Cl. .............................................. 365/154; 326/40
(58) Field of Search ................................. 365/154, 155, 365/156; 326/40, 46

(56) References Cited

U.S. PATENT DOCUMENTS 5,828,608 * 10/1998 Nguyen et al. ...................... 365/154
5,831,907 * 11/1998 Trimberger ........................... 365/154

OTHER PUBLICATIONS

U.S. application No. 09/038,123, filed Mar. 11, 1998, pending.

* cited by examiner

Primary Examiner—Tan T. Nguyen
(74) Attorney, Agent, or Firm—William S. Galliani; Pennie & Edmonds LLP

(57) ABSTRACT

A random access memory cell includes a forward inverter and a feedback inverter connected to the forward inverter. The feedback inverter includes a ground access transistor configured to selectively connect and isolate the feedback inverter to ground. The ground access transistor is isolated from ground in response to a first digital state global clear signal generated during a global clear state. A set of random access memory cells are simultaneously programmed to store identical values in response to the first digital state global clear signal during the global clear state. The ground access transistor is connected to ground in response to a second digital state global clear signal generated during a programming state. Selected random access memory cells are programmed to store selected values in response to the second digital state global clear signal during the programming state.

27 Claims, 4 Drawing Sheets

COMPACT, LOW VOLTAGE, NOISE-IMMUNE RAM CELL

This application claims priority to the provisional patent application entitled "Compact, Low Voltage, Noise-Immune RAM Cell", Ser. No. 60/071,629, filed Jan. 16, 1998.

BRIEF DESCRIPTION OF THE INVENTION

This invention relates generally to Random Access Memory (RAM) cells. More particularly, this invention relates to a compact, low voltage, noise-immune RAM cell for use in programmable logic devices and other electronic components.

BACKGROUND OF THE INVENTION

Random Access Memory (RAM) cells are well known in the art. Many RAM cells are optimized for frequent programming and rapid access times. The present invention is directed toward applications where these conditions are not critical. For example, in many programmable logic devices, RAM cell access times are not critical and the RAM cells are not programmed frequently.

FIG. 1 illustrates three prior art RAM cells 20A, 20B, and 20C in a First-In-First-Out (FIFO) configuration. Each RAM cell 20 includes a forward inverter 22 and a feedback inverter 24 collectively operating to store a single binary digit (bit). An address line (ADD) is associated with each RAM cell 20. Each address line is used to control an access transistor T.

The circuit of FIG. 1 operates in a FIFO manner because each RAM cell is driven by the RAM cell before it. For example, during programming, the address line (ADD_1) for RAM cell 20B is driven high, turning-on access transistor T1. As a result, the bit stored in RAM cell 20A is written into RAM cell 20B. This process is repeated until the bit is written to the desired RAM cell of the series string of RAM cells.

There are a number of problems with a FIFO RAM cell of the type shown in FIG. 1. One drawback is that it requires a relatively high supply voltage. That is, to successfully write a logical zero onto an output node of a destination cell, a logical one needs to be written into the destination cell from a source cell. For example, to obtain a logical zero at the output of destination cell 20C, a logical one must be written to the input of the cell. To insure a sufficient trip voltage for the inverter 22C, a relatively large voltage must be generated by the source cell 20B to overcome the voltage drop associated with the access transistor T2 at the input of the destination cell 20C.

Another problem with the prior art device of FIG. 1 is that it is relatively space intensive. The feedback inverter 24 of each cell 20 is a weak device with a relatively large channel length. The access transistors T are relatively conductive devices with relatively larger widths. These geometries require a relatively large amount of die area.

Another problem associated with the prior art device of FIG. 1 is its susceptibility to noise. A noise glitch on an address line (ADD) may turn on an access transistor T, resulting in a cell being overwritten by a previous serial cell. For example, a noise glitch on address line ADD_1 may turn on access transistor T1, causing a logical one from cell 20A to be written over a logical zero at the input of cell 20B.

In view of the foregoing, it would be highly desirable to develop a RAM cell that is noise-immune, compact, and does not require a large supply voltage.

SUMMARY OF THE INVENTION

A random access memory cell includes a forward inverter and a feedback inverter connected to the forward inverter. The feedback inverter includes a ground access transistor configured to selectively connect and isolate the feedback inverter to ground. The ground access transistor is isolated from ground in response to a first digital state global clear signal generated during a global clear state. A set of random access memory cells are simultaneously programmed to store identical values in response to the first digital state global clear signal during the global clear state. The ground access transistor is connected to ground in response to a second digital state global clear signal generated during a programming state. Selected random access memory cells are programmed to store selected values in response to the second digital state global clear signal during the programming state. The circuit allows for a compact, low voltage, noise-immune random access memory cell optimized for field programmable logic devices and other applications where write access times and programming times are not critical.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
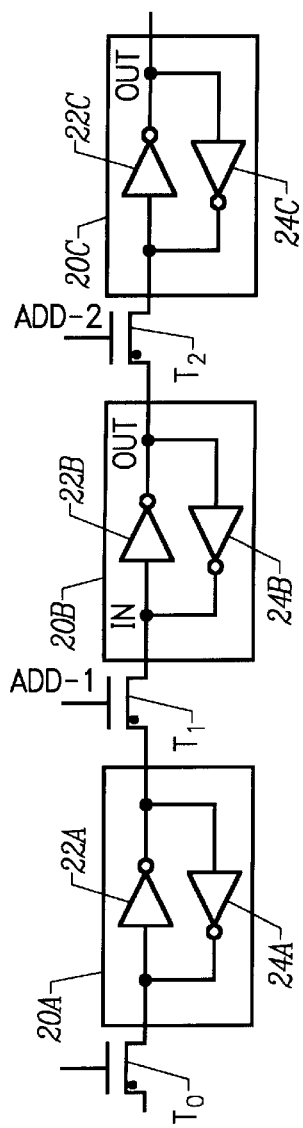
FIG. 1 illustrates a set of RAM cells constructed in accordance with the prior art.
Figure 2:
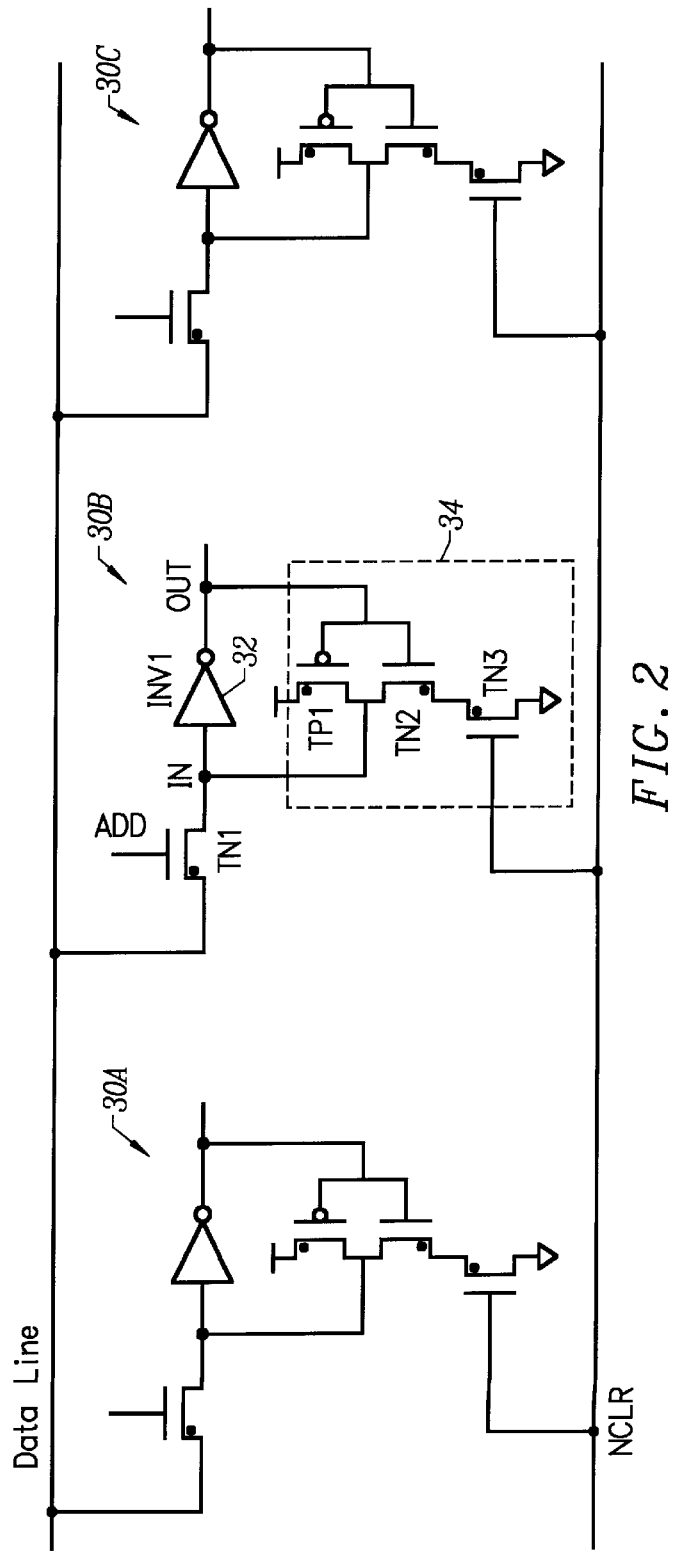
FIG. 2 illustrates a set of RAM cells constructed in accordance with an embodiment of the invention.

FIG. 2 illustrates three RAM cells 30A, 30B, and 30C constructed in accordance with an embodiment of the present invention. Each RAM cell 30 is connected between a data line and a global clear line (NCLR), as shown in the figure. Each RAM cell also includes a connection to an address line (ADD), which is connected to an access transistor TN1. The access transistor TN1 is connected to a standard forward inverter 32 and a feedback inverter 34 comprising transistors TP1, TN2, and TN3. The feedback inverter 34 includes a ground access transistor TN3 to selectively connect and isolate the feedback inverter 34 from ground, thereby controlling the output of the RAM cell, as discussed below.

The access transistor TN1 includes an input node connected to the data line, a control gate connected to the address line (ADD), and an output node connected to the input node (IN) of the forward inverter 32. The feedback inverter 34 includes an input node connected to the output node of the forward inverter 32. The feedback inverter 34 also includes an output node connected to the input node of the forward inverter 32.

Figure 3:
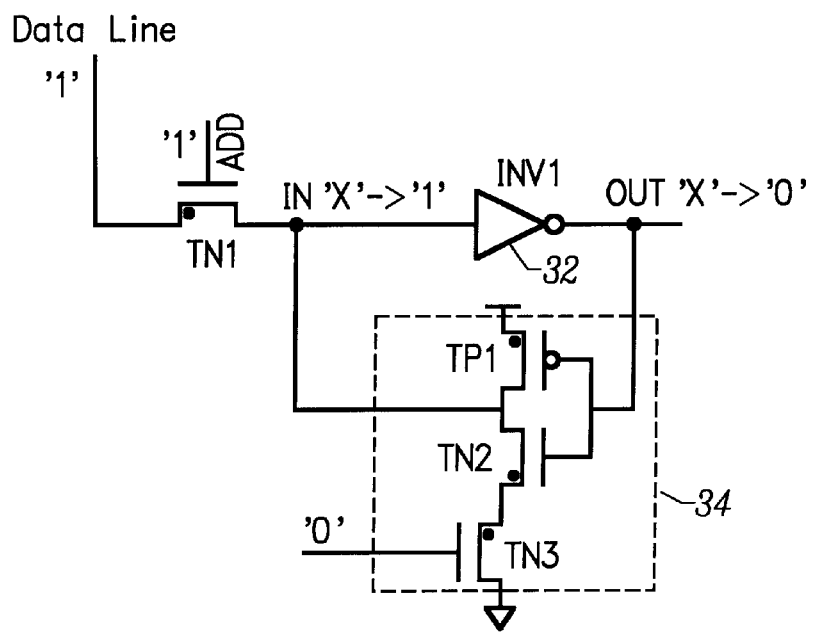
FIG. 3 illustrates the operation of a RAM cell of FIG. 2 during a global clear operation.

The RAM cell of the invention operates in a global clear mode and a programming mode. In the global clear mode, the outputs of all the RAM cells are driven low. This is done in the following manner. The global data line is driven to a digital high value, while the global clear line (NCLR) is driven low. The low signal on the global clear line (NCLR) causes transistor TN3 to turn-off, disconnecting the feedback inverter from ground. At the same time, the address lines (ADD) are driven with a digital high signal. The address line turns on transistor TN1, allowing the digital high signal on the data line to charge the input node to the forward inverter 32 to a digital high value. This causes the output of the forward inverter 32 to go low. This signal sequence is illustrated in FIG. 3.

Observe that with this configuration, unlike the prior art, it is not necessary to have a high conductance access transistor TN1. In addition, a weak feedback inverter is not required. Thus, the relatively large access transistor with high conductance and weak feedback inverter of the prior art are unnecessary, allowing for a more compact RAM cell. The RAM cell of the invention can be implemented with devices of a minimum size. The limiting factor on operating voltage is the threshold voltage of TN1. The voltage supply must be greater than the voltage trip point and voltage threshold of TN1.

After the foregoing global clear operation is performed, the RAM cells may be programmed in the following manner. The global clear line (NCLR) is driven high, which turns-on the ground access transistor TN3, causing the ground access transistor TN3 to be connected to ground.

Figure 4:
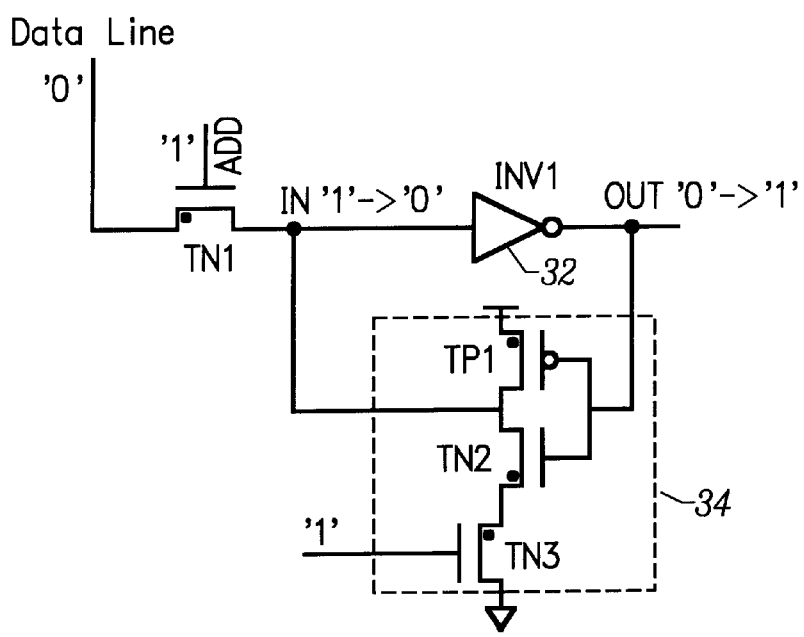
FIG. 4 illustrates the operation of a RAM cell of FIG. 2 when programming a logical one value.

When a particular RAM cell needs to be written, its address line is driven high and the data line is driven to the complement of the value that needs to be stored in the RAM cell. For example, if a digital high value is to be stored, then the data line is driven low. The address line (ADD) is driven high, so transistor TN1 is turned-on and therefore applies the digital low value to the input node of inverter 32, as shown in FIG. 4. TP1 and TN1 are sized such that when both TP1 and TN1 are activated, the voltage on the input node IN is below the trip point of inverter 32, which allows the output node to go high.

Figure 5:
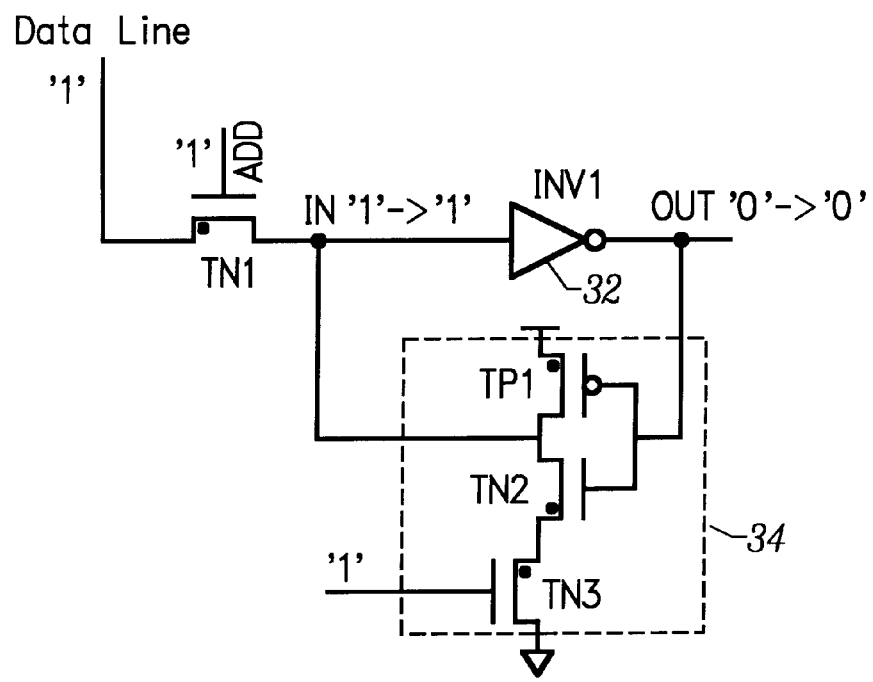
FIG. 5 illustrates the operation of a RAM cell of FIG. 2 when programming a logical zero value.

FIG. 5 illustrates the case of writing a digital low value to the RAM cell. This operation is identical to the global clear stage described in reference to FIG. 3, with the exception that the transistor TN3 is on during the process. The fact that transistor TN3 is on during this operation is irrelevant since transistor TN2 is off.

After the RAM cells are programmed, the signals on the data line and NCLR line are driven high and the address lines are driven low. This configuration will provide noise immunity. For example, if there is a signal glitch on the data line, no data loss will occur because the access transistor TN1 isolates the RAM cell from the data line.

Similarly, no data loss will occur if there is a signal glitch on the NCLR line. Even though a signal glitch on the NCLR line will cause the feedback inverter to be temporarily disconnected from ground, charge will remain trapped on the input node IN because the transistor TN2 will remain off.

If the address line (ADD) glitches, there are two cases to consider. If the RAM cell output is zero, a signal glitch will continue to drive the zero output. That is, if the transistor TN1 turns-on because of a signal glitch, the digital high value from the data line will cause the inverter 32 to continue to produce a digital low value at its output. If the RAM cell output is one, a signal glitch on the address line will not disturb the output if the transistors TN1, TN2, and TN3 are sized such that the voltage at node IN is less than the trip point of the inverter 32. That is, TN1, TN2, and TN3 form a voltage divider. The respective devices are sized to create a voltage below the trip point of the inverter 32 when in a programmed state. In this event, the output of the inverter 32 is not disturbed.

Figure 6:
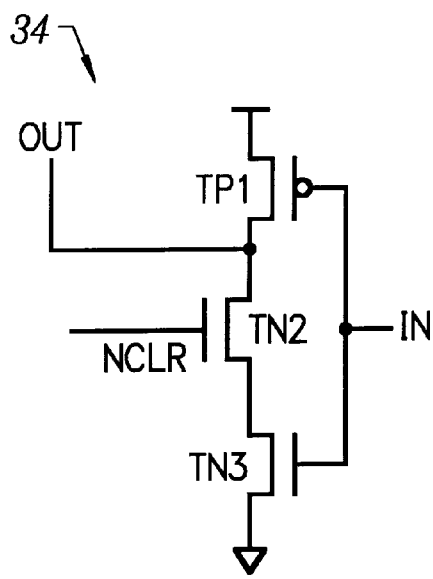
FIG. 6 illustrates an alternate embodiment of a feedback inverter that may be used in accordance with the invention.

FIG. 6 illustrates an alternate embodiment of a feedback inverter 34A that may be used in accordance with the invention. The feedback inverter 34A includes the same transistors, but the transistors are connected in a different configuration. The overall functionality of the feedback inverter 34A is the same as that of its previously discussed counterpart 34.

Figure 7:
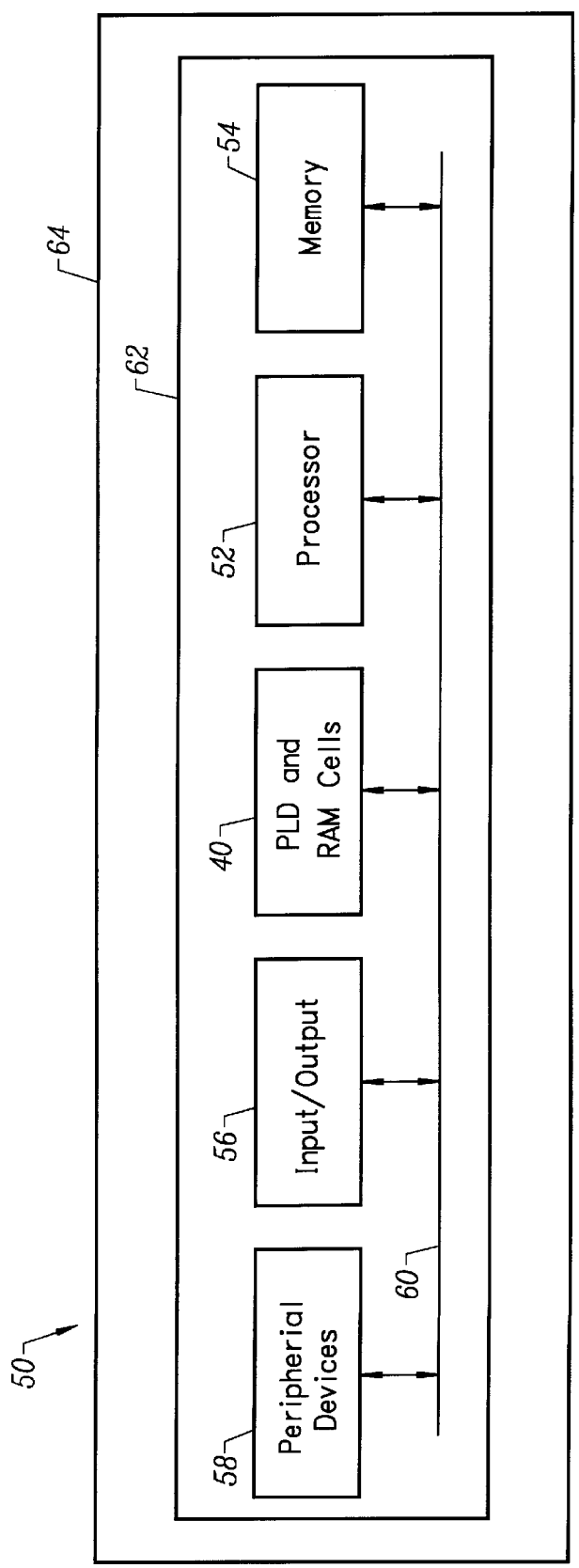
FIG. 7 illustrates a field programmable logic device incorporating the RAM cell of the invention, the field programmable logic device forming a portion of a data processing system.

FIG. 7 illustrates a programmable logic device 40 incorporating the RAM cells of the invention. More particularly, the figure illustrates the programmable logic device 40 embedded in a data processing system 50. The data processing system 50 may include one or more of the following components: a processor 52, memory 54, input/output circuitry 56, and peripheral devices 58. These components are coupled together by a system bus 60 and are populated on a circuit board 62, which is contained in an end-user system 64.

The system 50 can be used in a wide variety of applications, such as computer networking, data networking, instrumentation, video processing, digital signal processing, or any other application where the advantage of using reprogrammable logic and an EPROM is desirable. The device 40 can be used to perform a variety of logic functions. These functions may include using the device 40 as a processor or controller that works in cooperation with processor 52. The device 40 may also be used as an arbiter for arbitrating access to a shared resource in the system 50. In yet another example, the device 40 can be configured as an interface between the processor 52 and one of the other components in the system 50. It should be noted that the system 50 is only exemplary, and that the true scope and spirit of the invention should be indicated by the claims.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

I claim:

1. A random access memory cell, comprising:
    a forward inverter; and
    a feedback inverter connected to said forward inverter, said feedback inverter including a ground access transistor configured to selectively connect and isolate said feedback inverter to ground.

2. The random access memory cell of claim 1 further comprising an access transistor with an access transistor input node connected to a data line, an access transistor gate connected to an address line, and an access transistor output node connected to said forward inverter and said feedback inverter.

3. The random access memory cell of claim 2 wherein said access transistor and selected transistors of said feedback inverter form a voltage divider when said random access memory cell is in a programmed state, such that an inadvertent logical high voltage on an input node of said forward inverter is less than the trip voltage of said forward inverter.

4. The random access memory cell of claim 1 in combination with a field programmable logic device.

5. The random access memory cell of claim 4 further comprising a system bus connected to said field programmable logic device.

6. The random access memory cell of claim 5 further comprising a processor connected to said system bus.

7. The random access memory cell of claim 5 further comprising a memory connected to said system bus.

8. The random access memory cell of claim 5 further comprising input/output circuitry connected to said system bus.

9. The random access memory cell of claim 5 further comprising a peripheral device connected to said system bus.

10. The random access memory cell of claim 1 wherein said ground access transistor is isolated from ground in response to a first digital state global clear signal generated during a global clear state.

11. The random access memory cell of claim 10 in combination with a field programmable logic device comprising a plurality of random access memory cells, wherein said plurality of random access memory cells are simultaneously programmed to store identical values in response to said first digital state global clear signal.

12. The random access memory cell of claim 1 wherein said ground access transistor is connected to ground in response to a second digital state global clear signal generated during a programming state.

13. The random access memory cell of claim 12 in combination with a field programmable logic device comprising a plurality of random access memory cells, wherein selected random access memory cells are programmed to store selected values in response to said second digital state global clear signal.

14. A random access memory cell, comprising:
a data line;
an address line;
a global clear line;
an access transistor with an access transistor input node, an access transistor output node, and an access transistor control gate, said access transistor input node being connected to said data line and said access transistor control gate being connected to said address line;
a forward inverter with a forward inverter input node and a forward inverter output node, said forward inverter input node being connected to said access transistor output node; and
a feedback inverter including a feedback inverter input node, a feedback inverter output node, and a feedback inverter control node, said feedback inverter input node being connected to said forward inverter output node, said feedback inverter output node being connected to said access transistor output node, and said feedback inverter control node being connected to said global clear line.

15. The random access memory cell of claim 14 wherein said access transistor and selected transistors of said feedback inverter form a voltage divider when said random access memory cell is in a programmed state, such that an inadvertent logical high voltage on an input node of said forward inverter is less than the trip voltage of said forward inverter.

16. The random access memory cell of claim 14 in combination with a field programmable logic device.

17. The random access memory cell of claim 16 further comprising a system bus connected to said field programmable logic device.

18. The random access memory cell of claim 17 further comprising a processor connected to said system bus.

19. The random access memory cell of claim 17 further comprising a memory connected to said system bus.

20. The random access memory cell of claim 17 further comprising input/output circuitry connected to said system bus.

21. The random access memory cell of claim 17 further comprising a peripheral device connected to said system bus.

22. A method of operating a random access memory cell, said method comprising the steps of:
using a forward inverter and a feedback inverter to store a signal; and
controlling a ground access transistor of said feedback inverter to selectively connect and isolate said feedback inverter to ground.

23. The method of claim 22 further comprising the step of forming a voltage divider between an access transistor and selected transistors of said feedback inverter when said random access memory cell is in a programmed state, such that an inadvertent logical high voltage on an input node of said forward inverter is less than the trip voltage of said forward inverter.

24. The method of claim 22 wherein said controlling step includes the step of isolating said ground access transistor from ground in response to a first digital state global clear signal generated during a global clear state.

25. The method of claim 24 wherein said controlling step includes the step of simultaneously isolating a plurality of random access memory cells from ground in response to said first digital state global clear signal such that said plurality of random access memory cells store identical values.

26. The method of claim 22 wherein said controlling step includes the step of connecting said ground access transistor to ground in response to a second digital state global clear signal generated during a programming state.

27. The method of claim 26 wherein said controlling step includes the step of connecting said ground access transistor to ground during said programming state in response to said second digital stage global clear signal in order to program a selected digital value into a random access memory cell connected to said selected ground access transistor.

* * * * *